United States Patent [19]

Radlowe et al.

[11] 3,847,770

[45] Nov. 12, 1974

[54] PHOTOPOLYMERIZABLE COMPOSITIONS PREPARED FROM BETA HYDROXY ESTERS AND POLYITACONATES

[75] Inventors: Sol B. Radlowe, Chicago; Abraham Ravve, Lincolnwood; Kenneth H. Brown, Chicago, all of Ill.

[73] Assignee: Continental Can Company, Inc., New York, N.Y.

[22] Filed: Nov. 12, 1973

[21] Appl. No.: 424,150

Related U.S. Application Data

[62] Division of Ser. No. 242,793, April 10, 1972, Pat. No. 3,804,735.

[52] U.S. Cl. ........... 204/159.23, 96/35.1, 96/115 P, 106/20, 117/93.31, 117/132 BE, 204/159.14, 204/159.15, 204/159.19, 260/836, 260/837 R, 260/42.28

[51] Int. Cl. .......................... C08d 1/00, C08f 1/16

[58] Field of Search..... 204/159.15, 159.23, 159.24, 204/159.19; 260/836, 837; 96/115 P

[56] References Cited

UNITED STATES PATENTS 3,804,735 4/1974 Radlove et al. ............... 204/159.23

*Primary Examiner*—Murray Tillman
*Assistant Examiner*—Richard B. Turner
*Attorney, Agent, or Firm*—Paul Shapiro; Joseph E. Kerwin; William A. Dittmann

[57] ABSTRACT

A photopolymerizable composition comprised of a major amount of beta-hydroxy ester and a minor amount of a polymerizable ester derived from itaconic acid. Optionally the compositions contain a polyacrylate and a photosensitizer.

The photopolymerizable compositions are useful in the preparation of vehicles for printing inks which when printed on a substrate dry rapidly under irradiation with ultraviolet light. Superior adhesion of the compositions to metal surfaces is obtained by heating the irradiated composition.

16 Claims, No Drawings

PHOTOPOLYMERIZABLE COMPOSITIONS PREPARED FROM BETA HYDROXY ESTERS AND POLYITACONATES

This is a division of Ser. No. 242,793, filed Apr. 10, 1972, now U.S. Pat. No. 3,804,735, issued Apr. 16, 1974.

BACKGROUND OF THE INVENTION

1. Field of the Invention

This invention relates to photopolymerizable compositions and more particularly to photopolymerizable compositions which are useful as printing ink vehicles which undergo rapid polymerization on exposure to ultraviolet radiation.

2. The Prior Art

Printing or decorating metal substrates is conventionally accomplished using inks composed predominately of a drying oil vehicle pigmented to the desired color which dry by baking in air. Printing inks prepared with drying oil vehicles also contain a substantial amount of a volatile organic solvent which must be removed as the ink dries. The removal of the solvent creates an air pollution problem which many present day communities will not tolerate.

One method of avoiding the use of solvents in preparing printing ink vehicles which has been attempted by the art is to prepare the vehicle from an unsaturated composition of suitable viscosity which can be polymerized and dried by exposure to ultraviolet radiation as for example, U.S. Pat. Nos. 2,453,769, 2,453,770, 3,013,895, 3,051,591, 3,326,710, and 3,511,710. These vehicle compositions have not been totally successful in metal decorating.

SUMMARY OF THE INVENTION

In accordance with the present invention, there is provided a photopolymerizable composition useful as a printing ink vehicle which polymerizes upon irradiation with ultraviolet light to a hard insoluble film, which composition is comprised of a mixture of a major amount, i.e., greater than about 30% by weight of (1) an ethylenically unsaturated beta-hydroxy ester, and (2) a minor amount, i.e., less than about 20% by weight of a polyitaconate. Optionally a polyacrylate and a photosensitizer may be incorporated in the photo-polymerizable composition.

Printing inks, prepared using the compositions of this invention as vehicles exhibit excellent adhesion to a variety of substrates and printed impressions made with these inks may be dried in 1–2 seconds when exposed to ultraviolet light. As no volatile solvents remaining after the preparation of these ink vehicles, the pollution problem previously encountered with solvent removal is also avoided.

PREFERRED EMBODIMENTS

The unsaturated beta-hydroxy ester component of the compositions of the present invention are obtained by reacting a polyepoxide with an alpha, beta-ethylenically unsaturated monocarboxylic acid.

Temperatures employed in the reaction to form the beta-hydroxy ester will generally vary from about 50° to 150°C and preferably about 95° to 110°C. The reaction is conducted under an inert atmosphere such as nitrogen, and may be conducted at atmospheric or reduced pressure under reflux conditions.

The reaction to form the beta-hydroxy ester requires about a 1 to 10 hour period to be completed or until the alpha, beta-ethylenically unsaturated mono-carboxylic acid is substantially consumed.

The reaction to prepare the ethylenically unsaturated beta-hydroxy ester may be conducted in the presence or absence of solvents or diluents. In cases where the reactants are liquid, the reaction may be effected in the absence of solvents. When either or both reactants are solids or viscous liquids, it may be desirable to add solvents to assist in effecting the reaction. Examples of suitable solvents include inert organic liquids such as ketones, such as methyl ethyl ketone, hydrocarbons such as cyclohexane and aromatic solvents such as toluene and xylene.

The reaction to prepare the ethylenically unsaturated beta-hydroxy ester includes catalysts such as tertiary amines, quaternary ammonium hydroxides, benzyl trimethyl ammonium hydroxide, N,N-dimethylaniline, N,N-benzyl dimethyl amine, potassium hydroxide, lithium hydroxide, to accelerate the rate of reaction.

The amount of catalyst incorporated in the reaction mixture may vary over a considerable range. In general, the amount of the catalyst will vary from about 0.2% to about 2.0% by weight and more preferably from 0.5% to 1.0% by weight of the reactants. To obtain a gel stable beta-hydroxy ester, it is preferred that a small amount e.g, 0.10 to about 1% by weight of the reaction mixture of a tin salt such as $SnCl_2$ be incorporated in the reaction mixture as more fully disclosed in a concurrently filed, copending application to Sol B. Radlove, Ser. No. 242,777 filed Apr. 10, 1972 and now abandoned.

The proportions of ethylenically unsaturated alpha, beta-monocarboxylic acid and polyepoxide employed in preparing the ethylenically unsaturated beta-hydroxy ester compositions of the present invention are not critical. In general, the molar ratio of polyepoxide to ethylenically unsaturated mono-carboxylic acid ranges from about 1:1 to about 1:2.

The alpha, beta-ethylenically unsaturated monocarboxylic acid which may be reacted with the polyepoxide to prepare the beta-hydroxy esters in accordance with the process of the present invention include the monocarboxylic acids having 3 to 6 carbon atoms such as acrylic acid, methyacrylic acid, ethacrylic acid and crotonic acid. Of these, acrylic and methacrylic acids are preferred.

The term "polyepoxide" as used in the present specification means all those organic compounds containing at least two reactive epoxy groups, i.e.

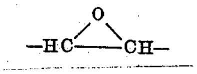

groups in their molecule. The polyepoxides may be saturated or unsaturated, aliphatic, cycloaliphatic, aromatic, or heterocyclic and may be substituted if desired with non-interfering substituents.

The glycidyl ethers of polyhydric phenols otherwise referred to as aromatic polyepoxides and the glycidyl ethers of polyhydric aliphatic alcohols otherwise referred to as aliphatic polyepoxides are preferred polyepoxides in preparing the compositions of the present invention.

Aromatic polyepoxides are the polymeric reaction products of polyhydric mono and polynuclear phenols with polyfunctional halohydrins and/or glycerol dichlorohydrin. A large number of polyepoxides of this type are disclosed in the Greenlee patents, U.S. Pat. No. 2,585,115 and No. 2,589,245. In addition, many of these resins are commercially available products. Typical polyhydroxy phenols useful in the preparation of aromatic polyepoxides include resorcinol and various diphenols resulting from the condensation of phenol with aldehydes and ketones such as formaldehyde, acetaldehyde, acetone, methyl ethyl ketone and the like. A typical aromatic polyepoxide is the reaction product of epichlorohydrin and 2,2-bis(p-hydroxy phenyl) propane (Bisphenol A), the residue having the following structural formula:

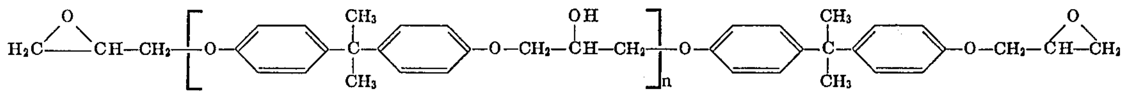

wherein *n* is zero or an interger up to 10. Generally speaking, *n* is no greater than 2 or 3 and is preferably 1 or less.

In DER 332, an aromatic polyepoxide of the type above described and commercially available from the Dow Chemical Company, *n* is zero.

Also included in the class of aromatic polyepoxides used to prepare the beta-hydroxy esters are the epoxylated novalacs, i.e., the glycidyl ethers of phenol-formaldehyde condensates having the formula:

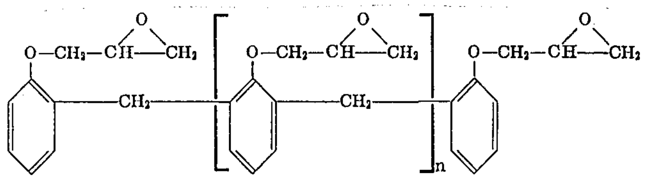

wherein R is hydrogen or an alkyl radial and *n* is integer of 1 to 10. The preparation of these epoxides is more fully disclosed in U.S. Pat. No. 2,216,099 and U.S. Pat. No. 2,658,885.

Examples of aliphatic polyepoxides which may be used to prepare the compositions of the present invention are the poly (epoxyalkyl) ethers which are the reaction products of ephihalohydrins with aliphatic polyhydric alcohols such as trimethylol propane, glycerol, pentaerythritol, sorbitol, erythritol, arabitol, mannitol, trimethylene glycol, tetramethylene glycol, ethylene glycol, polyethylene glycol, propylene glycol, polypropylene glycol, butylene glycol, polybutylene glycol and the like.

RD-2, the digylcidyl ether of 1, 4 butylene glycol, manufactured by Ciba is an example of a commercially available aliphatic polyepoxide.

In preparing the beta-hydroxy ester, a portion of the ethylenically unsaturated monocarboxylic acids may be replaced with a saturated monocarboxylic acid to vary the physical properties of the resultant beta-hydroxy ester. Exemplary of suitable saturated acids are the fatty monocarboxylic acids having 3 to 18 carbon atoms, such as valeric, caproic, pelargonic, undecylic, myristic, palmitic, and stearic acids. Preferably, the amount of the saturated mono-carboxylic acid component incorporated in the reaction mixture to form the beta-hydroxy ester does not exceed 25 mole percent of the total acid and is generally in the range of about 5 to about 20 mole percent.

In preparing beta-hydroxy esters useful as printing ink vehicle components, the incorporation of about 10 mole percent pelargonic acid has been found to materially enhance the pigment wetting properties of the vehicle.

The term "polyitaconate" as used in the percent application means the reaction product of itaconic acid and a polyepoxide.

In preparing the polyitaconate, about 0.8 to about 1 mole itaconic acid and about 1 to about 1.2 mole polyepoxide are reacted under conditions similar to that employed in preparing the beta-hydroxy ester, namely, under an inert atmosphere such as nitrogen, at a temperature of 100°–120°C in the presence of 0.1 to 1.0% by weight of a catalyst such as benzyl dimethylamine, a polymerization inhibitor such as hydroquinone and a solvent such as methyl ethyl ketone for 1 to 10 hours.

In preparing polyitaconates to be used as printing ink vehicle components it is preferred that the itaconic acid be reacted with a mixture of polyepoxides, namely the polyepoxide component of the reaction mixture is comprised of about 50 to about 80% by weight of an aromatic polyepoxide, and about 20 to about 50% by weight of an aliphatic polyepoxide. If the polyitaconate is prepared using polyepoxides wherein the aliphatic polyepoxide component is greater than 50% by weight of the polyepoxide component, the resultant polyitaconate when incorporated in the printing ink vehicle will materially reduce the curing speed of the ink. If the aromatic polyepoxide content of the polyitaconate reaction mixture is greater than 80% by weight, such a polyitaconate reaction product when used as a printing ink vehicle component results in an ink which has unacceptably high tack and will overheat and destroy the printing rolls.

In preparing the polyitaconate, a portion of the itaconic acid may be replaced by a saturated dicarboxylic acid containing 9 to 40 carbon atoms. A preferred class of dicarboxylic acids are the $C_{36}$ aliphatic dibasic acids, or dimer acids prepared by the polymerization of $C_{18}$ unsaturated fatty acids. Dimer acids are available commercially, as for example the Empol Dimer Acids available from Emery Industries, Inc.

The amount of saturated dicarboxylic acid component incorporated in the polyitaconate reaction mixture does not exceed about 20 mole percent of the total acid and is generally in the range of about 5 to about 15 mole percent based on the itaconic acid used in the reaction mixture.

By the incorporation of a saturated polycarboxylic acid in the polyitaconate reaction mixture, there is obtained a polyitaconate reaction product which when incorporated in printing ink vehicles prepared in accordance with the present invention improves the pigment wetting and tack properties of the ink.

To facilitate the rapid dying of the compositions of the present invention, it is preferable to incorporate in the compositions about 0.10 to about 5.0 weight percent and preferably about 0.5 to about 1.5 weight percent of a suitable photosensitizer. Any photosensitizer known to the art to be useful in sensitizing the ultraviolet curing of unsaturated polyester resins may be incorporated in the compositions of the present invention. Photosensitizers found to be particularly useful in combination with the beta-hydroxy ester/polyitaconate mixtures of the present invention are derivatives of anthraquinone, namely alpha and beta chloro and beta-methyl anthraquinones such as 1-chloro, 2-chloro, 2-methyl, 2-ethyl and 1-chloro-2-methyl, anthraquinone.

To obtain coating compositions of a desired fluidity and viscosity, a polyacrylate may be incorporated in the beta-hydroxy ester/polyitaconate mixture. The polyacrylate acts as a non-volatile diluent for the beta-hydroxy ester/polytaconate mixture and also copolymerizes with this mixture when the mixture is exposed to irradiation by an ultraviolet source.

The term "polyacrylate" when used in the present application means an ethylenically unsaturated polyester prepared from a polyhydric alcohol having from 2 to 6 hydroxyl groups and an alpha, beta-ethylenically unsaturated monocarboxylic acid having from 3 to 6 carbon atoms, generally 50 to 100 percent of the hydroxy groups being esterified with the ethylenically unsaturated monocarboxylic acid.

Illustrative polyhydric alcohols which may be used to prepare the polyacrylate include ethylene glycol, polyethylene glycol, propylene glycol, polypropylene glycol, diethylene glycol, butanediol, trimethylolethane, trimethylolpropane, trimethylolhexane, glycerol mannitol, pentaerythritol and mixtures of these polyhydric alcohols.

Unsaturated monocarboxylic acids which may be reacted with the polyhydric alcohols to prepare the polyacrylates include acrylic acid, methacrylic acid and ethyacrylic acid. Examples of suitable polyacrylates which may be used as non-volatile, polymerizable diluents for the beta-hydroxy ester/polyitaconate compositions of the present invention include ethylene glycol diacrylate, diethylene glycol dimethyacrylate, butanediol diacrylate, trimethylolpropane triacrylate, sorbitol tetraacrylate, mannitol tetraacrylate, and particularly polyethylene glycol diacrylate and pentaerythritol tetraacrylate. When used in combination with the beta-hydroxy ester/polyitaconate mixture the polyacrylate is present in the mixture at a concentration of about 30 to about 70 percent by weight of the mixture.

The beta-hydroxy ester/polyitaconate mixtures of the present invention are useful as coating compositions for a variety a substrates such as metal, paper, wood and the like but are especially useful as printing ink vehicles.

Rapid ultraviolet curable printing ink vehicles contain 30 to 55% by weight, and preferably 40 to 50% by weight of the beta-hydroxy ester, 2 to 10% by weight and preferably about 2 to 6% by weight of the polyitaconate, 40 to 70% by weight and preferably 45 to 65% by weight of a polyacrylate or mixtures thereof and 0.10 to 5.0 by weight and preferably 0.5 to 1.5 by weight of a photosensitizer.

It is essential and critical to the preparation of ultraviolet polymerizable ink vehicles that the ink vehicle contain at least 2 to 10 percent by weight of the polyitaconate. If less than 2 percent by weight of the polyitaconate is incorporated in the ink vehicle, the ink prepared therefrom exhibits very poor wetting properties resulting in a poor print. If greater than 10 percent by weight of the polyitaconate is incorporated in the ink vehicle, the resultant ink will exhibit excessive tack.

As will hereinafter be illustrated, ultraviolet polymerizable inks prepared with ink vehicles in which the polyitaconate is absent exhibit poor adhesion and abrasion resistance when applied to metal substrates.

In general, printing inks prepared using ultraviolet polymerizable vehicles are prepared in the same manner as conventional printing inks only using the vehicle components as disclosed herein.

Coloring compounds used in preparing the ink compositions are dyes and pigments. Examples of these compounds are pigments such as cadmium yellow, cadmium red, cadmium maroon, black iron oxide, titanium dioxide, chrome green, gold silver, aluminum and copper; and dyes such as alizarine red, Prussion blue, auramin naphthol, malachite green and the like. Ordinarily the concentration of pigment or dye will be present in the ink vehicle at a concentration of about 5 to 70% by weight.

In printing metal surfaces with the ultraviolet polymerizable printing inks, the ink is applied using a printing press conventionally used for printing on a metal substrate. Conventional printing processes leave on the surface of the metal substrate a printed layer of approximately 0.1 to 0.2 mil thickness.

Once, the metal substrate, generally in the form of a sheet, is printed, the substrate is positioned to pass under a source of ultraviolet light to cure and dry the ink. In most instances, the ultraviolet light source is maintained at about 0.5 to about 5 inches from the printed substrate undergoing irradiation.

Rapid drying of the ink is effected within a 0.5 to 3.0 second period using ultraviolet light emitted from an artificial source having a wavelength in the range between 4,000A and 1,800A. The output of commercially available ultraviolet lamps or tubes can vary between 100 watts/in. to 200 watts/in. of lamp surface.

High pressure mercury vapor discharge lamps of quartz are the preferred source of ultraviolet light. Medium-pressure mercury vapor discharge tubes of quartz may be employed if desired.

When the compositions of the present invention are employed as printing ink vehicles, it is critical to obtaining superior adhesion of the printing ink to metal surfaces that the ink be dried in a two-stage drying sequence, namely exposing the applied photopolymerizable composition of the present invention to a source of ultraviolet radiation for 0.25 to 3 seconds followed by heating the irradiated coating. Heating may be effected by any means known to the art, e.g. hot air ovens and infra-red glow bars. Heating in air at a temperature of at least 150°C and generally at 160°C to 170°C for about 0.1 second to 10 minutes has been found effective. If either of the drying stages is omitted, or the exact sequence of drying stages is not followed, adhesion of the ink to the metal surface will be unacceptable for most commercial applications.

The present invention is illustrated, but not limited by the following example:

EXAMPLE

A. PREPARATION OF BETA-HYDROXY ESTER

An ethylenically unsaturated beta-hydroxy ester composed substantially of the reaction product of a polyepoxide and acrylic acid was prepared in accordance with the following procedure:

To a reaction vessel, equipped with a condenser, stirrer, thermometer, and nitrogen inlet means was charged the following reactants:

| | |
|---|---|
| Bisphenol A-diglycidyl ether (DER 332) | 10,000 grams |
| Glacial acrylic acid | 3,325 grams |
| Pelargonic acid | 790 grams |
| Benzyl dimethylamine | 100 grams |
| Stannous chloride (dispersed in 400 mls methyl ethyl ketone) | 50 grams |

The temperature of the reaction mixture was raised to and maintained at 102°C for 4.0 hours under nitrogen atmosphere. Titration of a sample of the reaction mixture with a 0.2N alcoholic KOH solution at this time indicated that the reaction mixture had an acid value of 1.83 indicating substantially complete reaction of the bisphenol ether with the acrylic acid.

The resultant reaction product was a clear pale solution. The bisphenol ether/acrylic acid ester reaction mixture was then treated with 25 grams of 86.7% $H_3PO_4$ in 1,250 mls methyl ethyl ketone and stirred for 1 hour at room temperature to inactivate the $SnCl_2$ and neutralize the catalyst.

B. PREPARATION OF THE POLYITACONATE

A polyitaconate composed primarily of the reaction product of a mixture of polyepoxides and itaconic acid was prepared in accordance with the following procedure:

To a reaction vessel, equipped with a condenser, stirrer, thermometer, and nitrogen inlet means was charged the following reactants:

| | |
|---|---|
| Bisphenol A-diglycidyl ether (DER 332) | 10,300 grams |
| Butylene glycol-diglycidyl ether (RD-2) | 2625 grams |
| Itaconic acid | 4550 grams |
| $C_{36}$ Dimer Acid (Empol 1010) | 2100 grams |
| Benzyl dimethylamine | 75 grams |
| Hydroquinone | 0.2 grams |
| Methyl ethyl ketone | 2500 mls. |

The temperature of the reaction mixture was raised and maintained at 108°–110°C for 3.5 hours under a nitrogen atmosphere. Titration of a sample of the reaction mixture with a 0.2N alcoholic KOH solution at this time indicated that the reaction mixture had an acid value of 36.5, indicating substantially complete reaction.

C. PREPARATION OF PRINTING INK

A white ink was prepared on a three roll mill using 50% of titanium dioxide pigment and 50% of an ink vehicle stripped of solvent having the following composition (based on 100% solids):

| | |
|---|---|
| Beta-hydroxy ester (prepared in A) | 44.1 grams |
| Polyitaconate (prepared in B) | 4.4 grams |
| Pentaerythritol tetraacrylate | 39.6 grams |
| Polyethylene glycol * diacrylate | 11.0 grams |
| 1-Chloro, 2-methyl anthraquinone | 1.0 grams |

* 200 molecular weight

The ink had a tack of 31.

using a conventional lithographic technique (ATF Chief 20 A printing press) the white ink was applied as a film to the entire surface of 4 × 8 inch QAR (quality as rolled) steel plates of the type used in the manufacture of metal cans.

After printing, the printed plates were placed on a continuously moving conveyor which passed under a high pressure mercury lamp. The radiation emitted by the lamp was approximately 200 watts/in. of lamp surface. The conveyor was adjusted so that the coated plates travelled under the surface of the ultraviolet lamp so that the plates were 1.0 inch from the lamp surface. The speed of the conveyor belt was adjusted so that the printed plates were exposed to the ultraviolet radiation for about 0.5 to 2 seconds to effect drying of the printed plates.

The ultraviolet irradiated plates were then placed in an air oven and baked for 5 to 10 minutes at 164°C.

For purposes of comparison the printing procedure of the Example was repeated with the exception that either the composition of the ink vehicle or the drying sequence was varied from that employed in the Example. The following tests were made on the dried ink film:

ADHESION

Adhesion of the dried ink film was determined by scoring the ink film with a sharp metal point in the shape of an "X" and then pressing a piece of adhesive cellophane tape against the "X" score and pulled to determine whether the ink film could be lifted from the metal substrate. Adhesion was rated Poor, if substantially all of the scored film could be removed, Fair if a small amount of the ink was removed, Good if a very small amount of ink was removed and Excellent if no ink was removed. In order to be acceptable for commercial use, the adhesion of the ink must have at least a Good rating.

PASTEURIZATION

The resistance of the dried ink film to pasteurization conditions was determined by placing the dried plate in an agitated water bath heated at 66°C for 30 minutes and then determining the adhesion in accordance with the adhesion test above described.

ABRASION

To determine the resistance of the dried ink film to abrasion, the dried film was rubbed 10 times with the edge of a steel can chime after exposure to pasturization conditions. If metal was exposed, the ink film was rated Poor, if no metal was exposed, but the film surface was marred, the ink film was rated Fair, if there was only slight marring of the ink film, the ink was rated Good and if the film was unmarred, the ink was rated Excellent. An abrasion rating of Good is necessary before the ink can be recommended for commercial use.

The results of the adhesion, pasteurization and abrasion tests are recorded in Table below. In the Table comparison tests are denoted by the symbol "C."

In the Table, ink vehicle "X" is the ink vehicle prepared in the Example, that is, an ink vehicle having the following composition:

| Component | Parts By Weight |
|---|---|
| Beta-hydroxy ester | 44.1 |
| Polyitaconate | 4.4 |
| Pentaerythritol tetraacrylate | 39.6 |
| Polyethylene glycol diacrylate | 11.0 |
| 1-chloro, 2-methyl anthraquinone | 1.0 |

Ink vehicle "Y" is the same as "X" except that ink vehicle "Y" did not contain any polyitaconate.

Ink vehicle "Z" is the same as "X" except that the ink vehicle "Z" did not contain any polyitaconate and the beta-hydroxy ester content was raised to 48.5 parts.

TABLE

| Test No. | Ink Vehicle No. | U.V. Exposure (Seconds) | Air Bake at 164°C (Minutes) | Adhesion | Pasteurization | Abrasion Resistance |
|---|---|---|---|---|---|---|
| 1 | X | 2.0 | 5 | Good | Good | Good |
| 2 | X | 1.0 | 5 | Good | Good | Good |
| 3 | X | 0.5 | 5 | Good | Good | Excellent |
| 4 | X | 2.0 | 10 | Good | Good | Excellent |
| 5 | X | 1.0 | 10 | Good | Good | Fair |
| 6 | X | 0.5 | 10 | Good | Good | Good |
| $C_1$ | X | 2.0 | 0 | Poor | Poor | Poor |
| $C_2$ | X | 1.0 | 0 | Poor | Poor | Poor |
| $C_3$ | X | 0.5 | 0 | Poor | Poor | Good |
| $C_4$ | X | 0 0 | 10 | Poor | Poor | — |
| $C_5$ | Y | 2.0 | 0 | * | * | Poor |
| $C_6$ | Y | 0.5 | 0 | * | * | Poor |
| $C_7$ | Y | 0.5 | 0 | * | * | Poor |
| $C_8$ | Y | 2.0 | 5 | * | * | Poor |
| $C_9$ | Y | 1.0 | 5 | * | * | Poor |
| $C_{10}$ | Y | 0.5 | 5 | * | * | Fair |
| $C_{11}$ | Y | 2.0 | 10 | * | * | Poor |
| $C_{12}$ | Y | 1.0 | 10 | * | * | Poor |
| $C_{13}$ | Y | 0.5 | 10 | * | * | Good |
| $C_{14}$ | Z | 2.0 | 0 | * | * | Poor |
| $C_{15}$ | Z | 1.0 | 0 | * | * | Poor |
| $C_{16}$ | Z | 0.5 | 0 | * | * | Poor |
| $C_{17}$ | Z | 2.0 | 5 | * | * | Poor |
| $C_{18}$ | Z | 1.0 | 5 | * | * | Poor |
| $C_{19}$ | Z | 0.5 | 5 | * | * | Poor |
| $C_{20}$ | Z | 2.0 | 10 | * | * | Poor |
| $C_{21}$ | Z | 1.0 | 10 | * | * | Poor |
| $C_{22}$ | Z | 0.5 | 10 | * | * | Poor |

*All printing made with inks formulated with Y and Z vehicle were unattractive as the ink was uneven and had poor coverage as the ink dewetted after application to the metal surface.

An examination of the data contained in the Table clearly indicates that the decoration of a steel substrate with printing inks in accordance with the present invention (Test numbers 1 through 6) is substantially superior in printability, adhesion and abrasion resistance to steel substrates decorated with printing inks in a manner outside the scope of the present invention (Test numbers $C_1$ through $C_{22}$).

What is claimed is:

1. An ultraviolet polymerizable printing ink comprised of a coloring compound in a vehicle comprised of i. about 30 to about 55 percent by weight of a beta-hydroxy ester prepared from a reaction mixture comprised of a polyepoxide containing at least two reactive epoxy groups and an alpha, beta-ethylenically unsaturated monocarboxylic acid having 3 to 6 carbon atoms, ii. 2 to 10 percent by weight of polyitaconate prepared from a reaction mixture comprised of a polyepoxide containing at least two reactive epoxy groups and itaconic acid, iii. about 40 to about 70 percent by weight of a polyacrylate prepared from a polyhydric alcohol having 2 to 6 hydroxyl groups and an alpha, beta-ethylenically unsaturated monocarboxylic acid having 3 to 6 carbon atoms and iv. about 0.1 to about 5.0 percent by weight of a photosensitizer.

2. The ink of claim 1 wherein a molar ratio of polyepoxide to ethylenically unsaturated acid ranging from about 1:1 to about 1:2 is used to prepare the beta-hydroxy ester.

3. The composition of claim 1 wherein about 0.8 to about 1.0 mole itaconic acid is reacted with about 1 to about 1.2 moles polyepoxide to prepare the polyitaconate.

4. The ink of claim 1 wherein the reaction mixture used to prepare the beta-hydroxy ester contains a minor amount of a saturated fatty acid containing 3 to 18 carbon atoms.

5. The ink of claim 1 wherein the polyepoxide component of reaction mixture used to prepare the polyitaconate is comprised of a mixture of about 50 to about 80 percent by weight of an aromatic polyepoxide and about 20 to about 50 percent by weight of an aliphatic polyepoxide.

6. The ink of claim 1 wherein the reaction mixture used to prepare the polyitaconate contains a minor amount of a saturated dicarboxylic having 9 to 40 carbon atoms.

7. The ink of claim 1 wherein the alpha, beta-ethylenically unsaturated monocarboxylic acid is arcylic acid.

8. The ink of claim 6 wherein the saturated monocarboxylic acid is pelargonic acid.

9. The ink of claim 5 wherein the aromatic polyepoxide is the diglycidyl ether of bisphenol A.

10. The ink of claim 1 wherein the aliphatic polyepoxide is the diglycidyl ether of butylene glycol.

11. The composition of claim 1 wherein the polyacrylate is pentaerythritol tetraacrylate.

12. The composition of claim 1 wherein the polyacrylate is polyethylene glycol diacrylate.

13. The composition of claim 1 wherein the photosensitizer is selected from the group consisting of alpha, and beta chloro- and beta-methyl anthraquinones.

14. The composition of claim 1 wherein the photosensitizer is 1-chloro, 2-methyl anthraquinone.

15. A method of printing on a substrate which comprises applying to the substrate by means of a printing press the ink of claim 1 and then sequentially (1) exposing the printed surface to a source of ultraviolet radiation followed by (2) heating the irradiated surface.

16. The method of claim 15 wherein the substrate is heated in air at a temperature of at least 150°C.

* * * * *